(12) United States Patent  (10) Patent No.: US 7,694,413 B2
Johnston et al.  (45) Date of Patent: Apr. 13, 2010

(54) METHOD OF MAKING A BOTTOMLESS VIA

(75) Inventors: Steven W. Johnston, Portland, OR (US); Chin-Chang Cheng, Portland, OR (US)

(73) Assignee: Intel Corporation, Santa Clara, CA (US)

(*) Notice: Subject to any disclaimer, the term of this patent is extended or adjusted under 35 U.S.C. 154(b) by 676 days.

(21) Appl. No.: 11/479,399

(22) Filed: Jun. 30, 2006

(65) Prior Publication Data

US 2008/0000678 A1 Jan. 3, 2008

(51) Int. Cl.
*H01R 43/00* (2006.01)
(52) U.S. Cl. .................... 29/825; 29/846; 438/686; 438/687; 438/688
(58) Field of Classification Search ............ 29/825, 29/846; 438/612, 687, 688, 686
See application file for complete search history.

(56) References Cited

U.S. PATENT DOCUMENTS

| | | | | |
|---|---|---|---|---|
| 5,969,422 A * | 10/1999 | Ting et al. | ............ | 257/762 |
| 6,069,068 A * | 5/2000 | Rathore et al. | ............ | 438/628 |
| 6,147,000 A * | 11/2000 | You et al. | ............ | 438/687 |
| 6,160,315 A * | 12/2000 | Chiang et al. | ............ | 257/762 |
| 6,251,781 B1 * | 6/2001 | Zhou et al. | ............ | 438/687 |
| 6,362,099 B1 * | 3/2002 | Gandikota et al. | ............ | 438/687 |
| 6,376,353 B1 * | 4/2002 | Zhou et al. | ............ | 438/612 |
| 6,399,479 B1 * | 6/2002 | Chen et al. | ............ | 438/628 |
| 6,495,200 B1 * | 12/2002 | Chan et al. | ............ | 438/626 |
| 6,720,262 B2 * | 4/2004 | Koh et al. | ............ | 438/687 |
| 6,756,302 B1 * | 6/2004 | Shan et al. | ............ | 438/653 |
| 6,797,620 B2 * | 9/2004 | Lewis et al. | ............ | 438/687 |
| 6,824,666 B2 * | 11/2004 | Gandikota et al. | ............ | 205/183 |
| 6,893,541 B2 * | 5/2005 | Chiang et al. | ............ | 204/192.17 |
| 6,903,916 B2 * | 6/2005 | Yamazaki et al. | ............ | 361/301.4 |
| 6,911,229 B2 * | 6/2005 | Andricacos et al. | ............ | 427/97.7 |
| 6,924,226 B2 * | 8/2005 | Cohen | ............ | 438/629 |
| 7,030,016 B2 * | 4/2006 | Feng et al. | ............ | 438/687 |
| 7,034,397 B2 * | 4/2006 | Raaijmakers et al. | ............ | 257/750 |
| 7,041,595 B2 * | 5/2006 | Chopra | ............ | 438/643 |
| 7,265,048 B2 * | 9/2007 | Chung et al. | ............ | 438/628 |
| 7,351,655 B2 * | 4/2008 | Cunningham | ............ | 438/653 |
| 7,432,192 B2 * | 10/2008 | Feng et al. | ............ | 438/627 |
| 7,446,032 B2 * | 11/2008 | Kailasam | ............ | 438/625 |
| 7,470,617 B2 * | 12/2008 | Chebiam et al. | ............ | 438/643 |

* cited by examiner

*Primary Examiner*—C. J Arbes
(74) *Attorney, Agent, or Firm*—Blakely, Sokoloff, Taylor & Zafman LLP

(57) ABSTRACT

A method for forming a copper interconnect is described. An opening in a dielectric layer disposed on a substrate is formed. A barrier layer is formed on the opening. A seed layer is formed on the barrier layer. The seed layer includes a noble metal copper alloy, the copper having less than 50% of the atomic weight of the noble metal copper alloy.

20 Claims, 8 Drawing Sheets

METHOD OF MAKING A BOTTOMLESS VIA

TECHNICAL FIELD

This invention relates to the field of processes for making semiconductor integrated circuits, and, in particular, to the field of electroplating or electroless plating integrated substrates.

BACKGROUND

One process used to form contacts through which electronic signals are sent and/or received between microelectronic devices is known as a "damascene process". In a typical damascene process, a photoresist material is patterned on a first surface of a dielectric material. The dielectric material is then etched through the photoresist material patterning to form a hole or trench extending at least partially into the dielectric material from the dielectric material first surface. The photoresist material is then removed (typically by an oxygen plasma) and a barrier layer may be deposited (such as by atomic layer deposition or physical vapor deposition) to line the hole or trench in order to prevent conductive material (particularly copper and copper-containing alloys), which will be subsequent be deposited into the opening, from migrating into dielectric material. The migration of the conductive material can adversely affect the quality of microelectronic device, such as leakage current and reliability circuit reliability.

After the formation of the barrier layer, a seed material is deposited (such as by physical vapor deposition) on the barrier layer. The seed material provides a nucleation site for a subsequent plating process, for example, performing a conventional copper electroplating process to form a copper layer. The resulting structure is planarized, usually by a technique called chemical mechanical polish (CMP), which removes the conductive material and barrier layer that is not within the hole from the surface of the dielectric material, to form a conductive via (if a hole is filled) or a trace (if a trench is filled), as will be understood to those skilled in the art.

Barrier layers used for copper-containing conductive materials are usually nitrogen-containing metals, including, but not limited to tantalum nitride, tantalum carbon nitride, titanium nitride, and titanium carbon nitride. One issue with noble metals used as seed layers directly in contact with a dielectric material is poor adhesion to such dielectric materials. Due to this poor adhesion, the noble metal film tends to dewet (agglomerate) during thermal annealing in later processes or delaminate after deposition. This can lead to poor electromigration performance and may generate voids during copper plating, if the noble seed layer becomes discontinuous, as will be understood by those skilled in the art. Delamination may also occur during the CMP process, if the adhesion is poor enough.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

A method for making a copper interconnect structure is described. That method comprises forming an opening in a dielectric layer disposed on a substrate, forming a barrier layer over the opening, and forming a seed layer over the barrier layer using a copper-noble metal alloy. The seed layer described herein may be a copper-noble metal alloy layer or a ternary copper-noble metal-reliability enhancing metal layer.

Figure 1A:
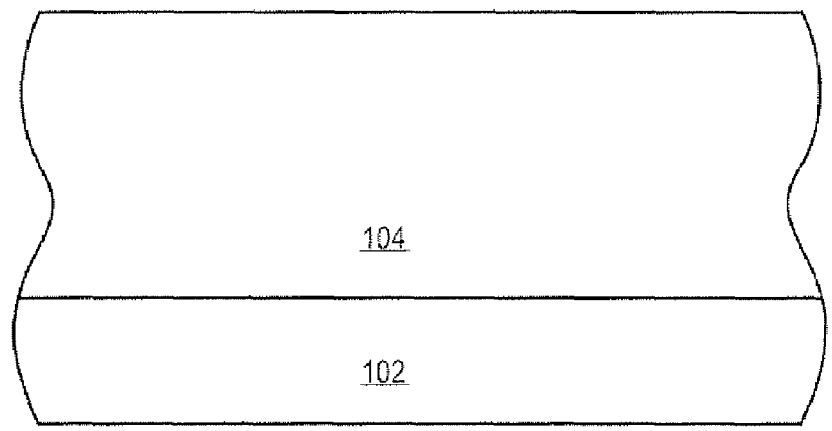
FIGS. 1A-1E illustrate cross-sections of structures that may be formed when carrying out an embodiment of a method of the present invention.

In FIG. 1A, a dielectric layer 104 is formed on a substrate 102. The substrate 102 may comprise materials such as silicon, silicon-on insulator, germanium, indium antimonide, lead telluride, indium arsenide, indium phosphide, gallium arsenide, or gallium antimonide. Although several examples of materials from which the substrate 102 may be formed are described here, any material that may serve as a foundation upon which a microelectronic device may be built falls within the spirit and scope of the present invention.

The dielectric layer 104 is formed on the substrate 102. Those skilled in the art will appreciate that the dielectric layer 104 may also be formed from a variety of materials, thicknesses or multiple layers of material. By way of illustration and not limitation, the dielectric layer 104 may include silicon dioxide, organic materials or inorganic materials. Although a few examples of materials that may be used to form the dielectric layer 104 are described here, that layer may be made from other materials that serve to separate and insulate the different metal layers.

The dielectric layer 104 may be formed on the substrate 102 using a conventional deposition method, e.g., a chemical vapor deposition ("CVD"), a low pressure CVD ("LPCVD"), a physical vapor deposition ("PVD"), a spin-on process. In most applications, the dielectric layer 104 thickness depends on the metal layer at which it is used and is typically less than one micron thick, and more specifically between about 1,000 angstroms and about 5,000 angstroms thick.

Figure 1B:
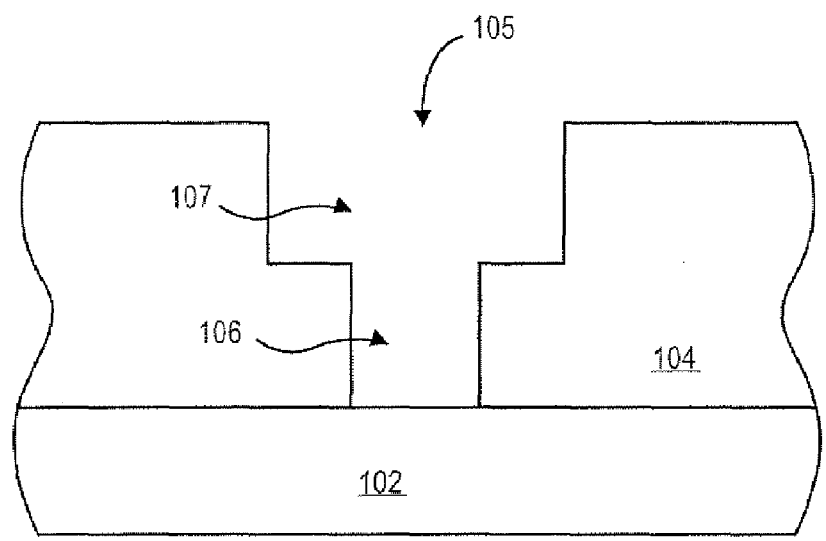

FIG. 1B, at least one opening 105 may be formed in the dielectric layer 104. The opening 105 may comprise at least one via 106, and at least one trench 107, which may be used to connect to other metal layers in the microelectronic device (not shown), according to the conventional damascene technique as is known by those skilled in the art. As such steps are well known in to those skilled in the art, they will not be described in more detail here.

Figure 1C:
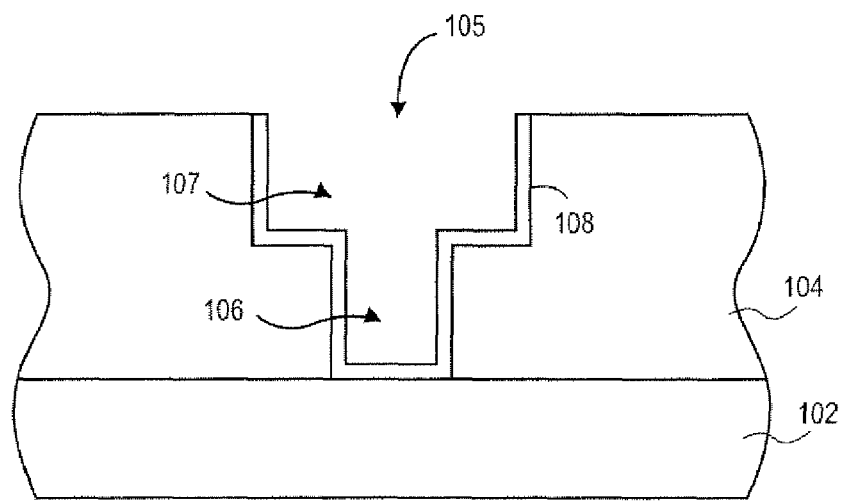

In FIG. 1C, following the formation of the opening 105, a barrier layer 108 is deposited onto the opening 105. Those skilled in the art will appreciate that barrier layer 108 may be formed from a variety of materials, thicknesses or multiple layers of material. By way of illustration and not limitation, the barrier layer 108 may be deposited using conventional techniques such as PVD, ALD, conventional CVD, low pressure CVD or other such methods known to those skilled in the art. In one embodiment, the barrier layer can include any one of the following materials: tantalum, tungsten, titanium, ruthenium, molybdenum, and their alloys with nitrogen, silicon and carbon. Although a few examples of materials that may be used to form the barrier layer 108 are described here, that layer may be made from other materials that serve to prevent the diffusion of a metal across the barrier layer 108. The barrier layer 108 can range from about 10 angstroms to about 300 angstroms. A thinner barrier layer 108 may range between about 10 angstroms and 50 angstoms. A thinner barrier layer makes less of a contribution to the overall resistance of the Copper interconnect structure.

Figure 1D:
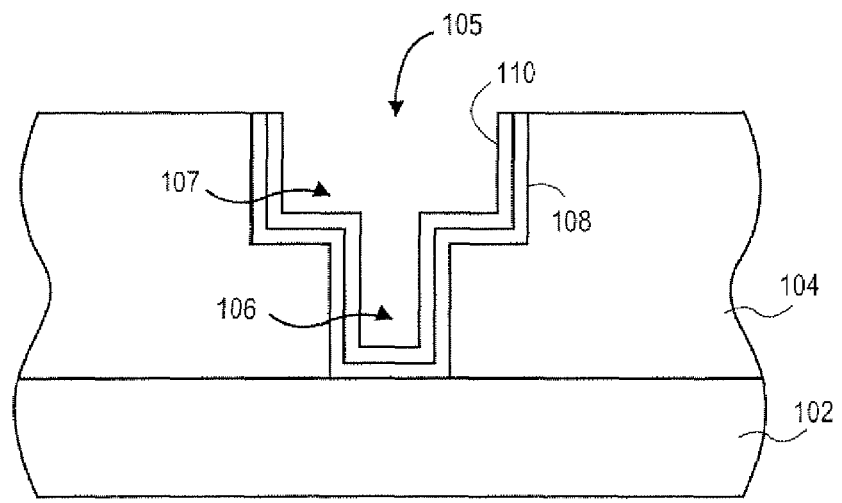

In FIG. 1D, a seed layer 110 may be formed on the barrier layer 108. In accordance with one embodiment, the seed layer 110 may comprise Copper alloys with noble metals such as silver, palladium, platinum, rhodium, ruthenium, gold, iridium and osmium. In accordance with one embodiment, the Copper alloy includes a minority atomic concentration of Copper, for example, less than 50%. For example, the seed layer 110 may comprise of 65% Ru, and 35% Cu. The presence of the Copper atoms in the seed layer serve as Copper nucleation sites for Copper plating resulting in a faster plating fill process. In another embodiment, the seed layer 110 may include not only a noble metal or noble metal-Cu alloy but also a reliability enhancing metal (RE metal) such as aluminum, tin, magnesium, manganese.

Some advantages of having the seed layer 110 comprise of copper alloy with noble metals include the lack of oxidation of a noble metal, the lack of etching of certain noble metals including Ru by the subsequent acidic Copper electroplating bath, and superior adhesion. The Copper elements in the seed layer 110 prevent the additional transient time required to form Copper nuclei on a pure noble metal seed layer. As such, the time required to adsorb Copper plating bath additives (prior to which conformal Cu plating occurs) may be minimized by providing initial Copper sites from the Copper alloy seed layer 110. Other advantages include a faster response time to adsorb Cu plating additives.

Those skilled in the art will appreciate that the seed layer 110 may be formed from a variety of materials, thicknesses or multiple layers of material. In one embodiment, the seed layer 110 may be between about 10 angstroms and 2,000 angstroms thick. The atomic percentage of noble metal in the seed layer 110 may be at least 50%.

The seed layer 110 may be formed on the barrier layer 108 using a conventional deposition method, e.g., a conventional CVD, low pressure CVD, PVD, ALD, or other such methods known to those skilled in the art. Although a few examples of materials that may be used to form the seed layer 110 are described here, the seed layer 110 may be made from other materials that serve as a starting film for filling the feature using electroless plating or electroplating of copper.

In accordance with one embodiment, the seed layer 110 may be formed using an alloyed sputter target. The copper-noble metal alloy or copper-noble metal-reliability enhancing alloy may be deposited using sputtering from a single target, or cosputtered.

In accordance with another embodiment, the seed layer 110 may be formed by simultaneous introduction of a noble metal and Copper precursors or noble metal, copper, and reliability enhancing metal precursors during CVD.

In accordance with another embodiment, the seed layer 110 may be formed by pulsed CVD where either the Copper precursor and reducing gas or the noble metal precursor and reducing gas are present and the Copper precursor or noble metal precursor that is not present is pulsed into the reactor. Similarly a reliability enhancing metal can be added to the film in a similar manner.

In accordance with another embodiment, the seed layer 110 may be formed using ALD where the Copper and noble metal precursors are pulsed into the reactor with each pulse followed by a purge gas pulse and potentially a pulse of reducing gas pulse. Similarly a reliability enhancing metal can be added to the film by having a third pulse sequence.

Figure 1E:
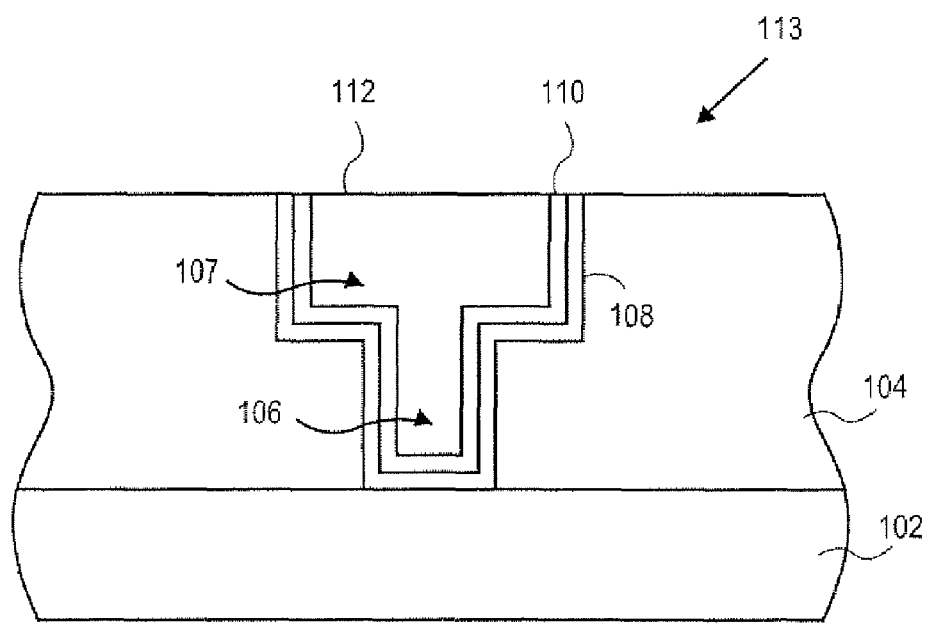

The copper deposition process may be performed using a conventional copper electroplating or electroless plating process, which is well known in the art, in which a single or dual damascene structure is filled with copper by using a direct current (DC) or pulsed electroplating process or by an electroless plating process. First, the surface of the seed layer 110 is exposed to a plating solution. Then, a Cu film 112 is formed on the surface of the seed layer 110 and used to fill the feature. FIG. 1E shows the structure after electroplating and a subsequent planarization processing to remove any excess copper and barrier layer.

In one embodiment, the electroplating or electroless plating solution may comprise copper ions, sulfuric acid, chloride ions, additives (such as suppressors i.e. polyethylene glycol, and anti-supressors i.e. di-sulfide), noble metal ions, noble metals and complexing agents (such as thiosulfate and peroxodisulfate). Although a few examples of materials that may comprise the electroplating or electroless plating solution are described here, that solution may comprise other materials that serve to deposit alloys of copper onto a surface, such as the barrier layer 108 or the seed layer 110 as illustrated in FIG. 1E.

Figure 2:
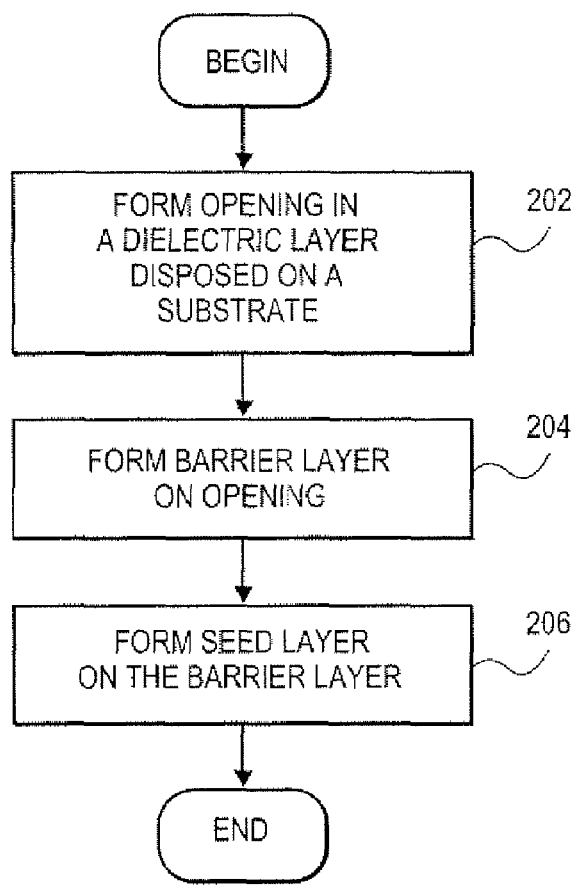
FIG. 2 is a process flow diagram in accordance with an embodiment of the present invention.

FIG. 2 is a process flow diagram illustrating a method in accordance with an embodiment of the present invention. At 202, an opening is formed in a dielectric layer disposed on a substrate. At 204, a barrier layer is formed on the opening. At 206, a seed layer is formed on the barrier layer. The seed layer may include a noble metal and copper alloy, the copper having less than 50% weight of the noble metal and copper alloy. Those of ordinary skills in the art will recognize that the copper or copper alloy may include impurities or additives.

There are various methods of forming the copper alloy layer. In one embodiment, the copper alloy layer may be formed by exposing the surface of the seed layer to an electroplating or electroless plating solution. In another embodiment, a layer of noble metal copper alloy is sputter deposited from an alloyed sputter target on the upper surface of the barrier layer. In another embodiment, a noble metal and Copper precursors are simultaneously introduced during a CVD process. In accordance with another embodiment, a Copper precursor or a noble precursor may be pulsed into a reactor during a pulsed CVD process. In accordance with another embodiment, a Copper precursor and a noble gas precursor are pulsed into a reactor during an ALD process with each pulse followed by a purge gas pulse.

Another embodiment of a method for making a copper interconnect structure is described. That method comprises forming an opening in a dielectric layer disposed on a substrate, forming a barrier layer over the opening, forming a seed layer on the barrier layer, and etching the barrier layer and seed layer at the bottom of a via to expose copper from an underlying metal layer. The seed layer could be a noble metal, a noble metal-Cu alloy, or a noble metal-Cu-reliability enhancing metal alloy. This embodiment is further described below with respect to FIGS. 3A-3C and 4.

Figure 3A:
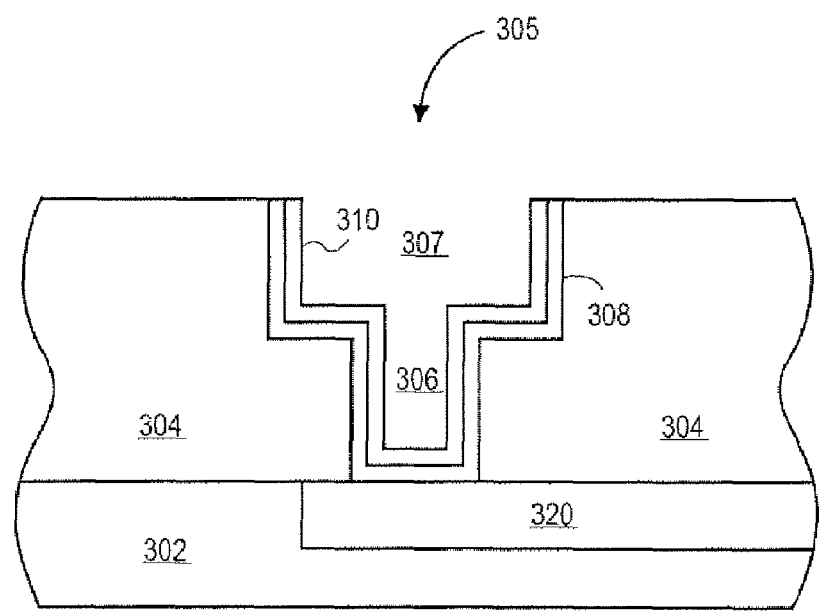
FIGS. 3A-3C illustrate cross-sections of structures that may be formed when carrying out another embodiment of a method of the present invention.
Figure 3B:
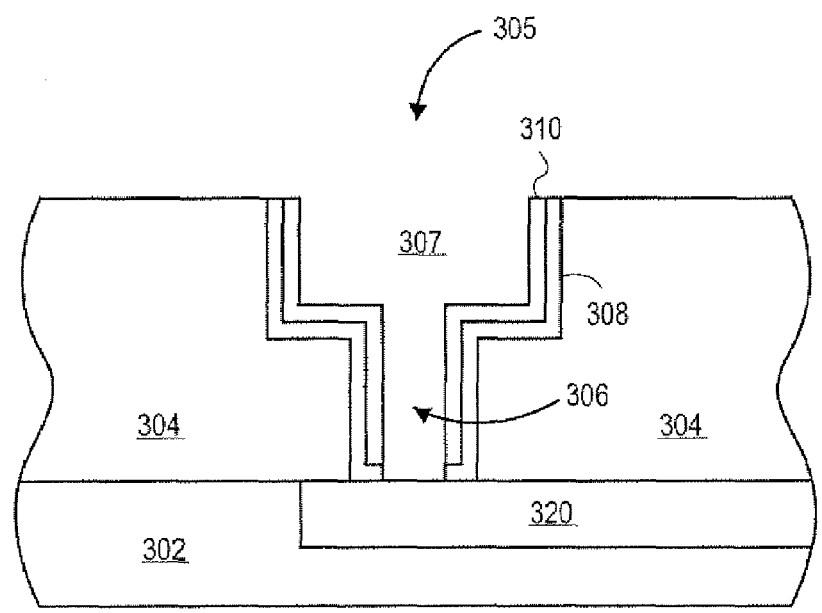
Figure 3C:
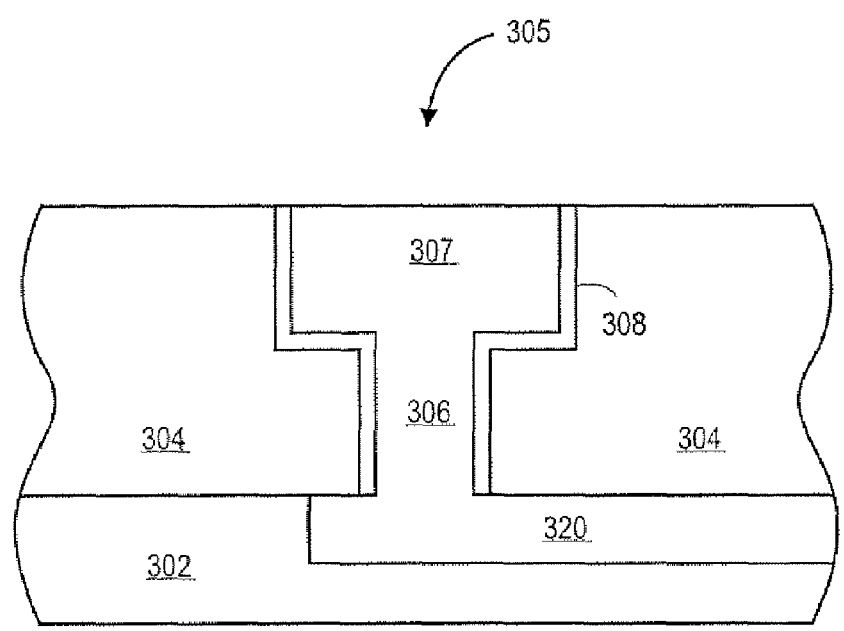

FIGS. 3A-3C illustrate cross-sections of structures that may be formed when carrying out another embodiment of a method of the present invention. In FIG. 3A, a dielectric layer 304 is formed on a copper interconnect 320 of a substrate 302. At least one opening 305 may be formed in the dielectric layer 304. The opening 305 may comprise at least one via 306, and at least one trench 307, which may be used to connect to other metal layers in the microelectronic device, such as, for example, an underlying metal layer 320. Because the steps of a damascene technique are well known by those skilled in the art, they will not be described in more detail here. A barrier layer 308 is deposited onto the opening 305. Embodiments of the barrier layer 308 were previously described. A seed layer 310 may be formed on the barrier layer 308. In accordance with one embodiment, the seed layer 310 may include a noble metal or a noble metal-Cu alloy. The noble metal may be, for example, silver, palladium, platinum, rhodium, ruthenium, gold, iridium and osmium. In another embodiment, the seed layer 310 may include not only a noble metal or noble metal-Cu alloy but also a reliability enhancing metal such as aluminum, tin, magnesium, manganese.

The seed layer 310 may be formed on the barrier layer 308 using a conventional deposition method, e.g., a conventional CVD, low pressure CVD, PVD, ALD, or other such methods known to those skilled in the art.

In FIG. 3B, the barrier layer 308 and the seed layer 310 at the bottom of the opening 305 are etched to expose the copper interconnect 320. In a first option, the structure can be immersed in a plating cell to fill the feature using conventional plating techniques. In a second option, the structure can be immersed in a cell on a plating tool that contains the anti-suppressor (ASUPP) additive but not the suppressor or leveler. This second option would allow the ASUPP adsorption on the exposed Copper.

The structure is then transferred to a separate cell on the plating tool where it would be immersed in the regular component plating bath and waveform. The presence of the already adsorbed ASUPP at the bottom of the opening 305 at the start of the plating process promotes a more rapid superfill in the opening 305 and thus widening the process winder for feature gapfill. Alternatively, the structure could be immersed in a plating bath containing all additive components. In this approach, the ASUPP additive would also preferentially absorb on the exposed Cu surface at the bottom of the via and provide rapid superfill in the opening 305 and thus widening the process window for feature gapfill.

FIG. 3C illustrates the structure after plating and planarization. The opening 305 is filled with copper. The copper deposition process may be performed using a conventional copper electroplating process, which is well known in the art, in which a single or dual damascene structure is filled with copper by using a direct current (DC) or pulsed electroplating process or by an electroless plating process. First, the surface of the seed layer 310 is exposed to a plating solution. Then, copper is then formed on the surface of the seed layer 310. The surface of the wafer is then planarized using chemical mechanical polishing or other similar technique to remove excess Cu and barrier on the field of the substrate.

Figure 4:
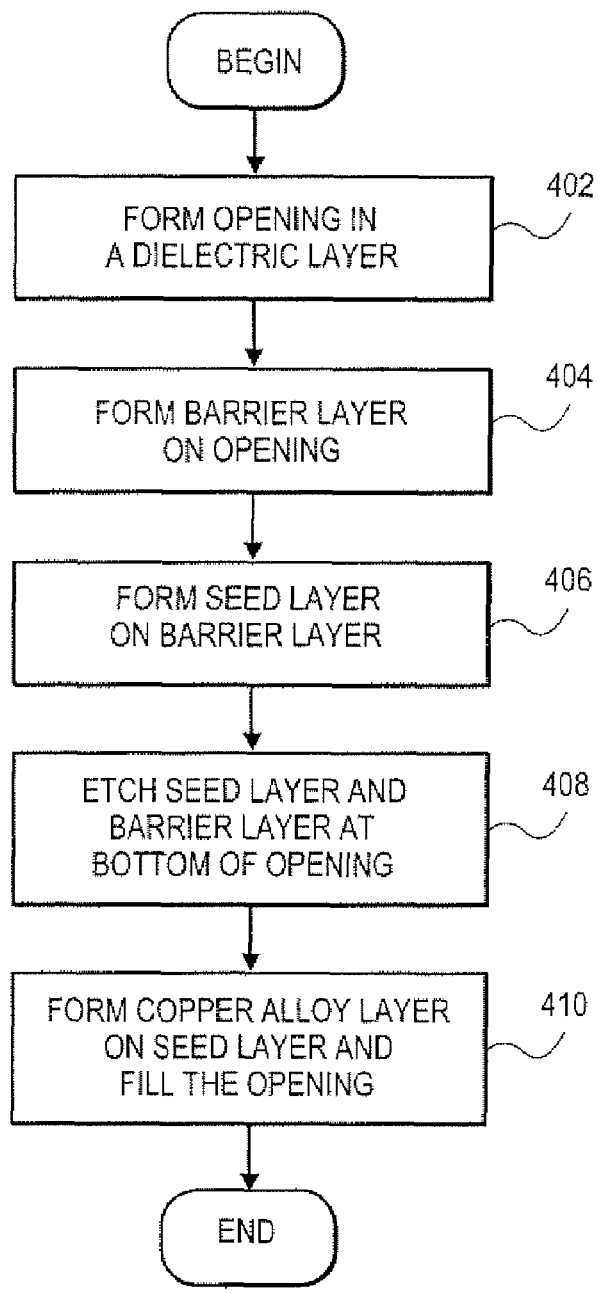
FIG. 4 is a process flow diagram in accordance with another embodiment of the present invention.

FIG. 4 is a process flow diagram in accordance with another embodiment of the present invention. At 402, an opening is formed in a dielectric layer disposed on a copper interconnect of a substrate. At 404, a barrier layer is formed on the dielectric layer and in the opening. At 406, a seed layer is formed on the barrier layer. The seed layer includes a noble metal, a noble metal-Cu alloy, or a noble metal-Cu-reliability enhancing metal. At 408, the barrier layer and the seed layer at the bottom of the opening are etched to expose the copper from the underlying interconnect layer. At 410, a copper layer may be formed on the seed layer and the opening is filled using an electroplating or electroless plating bath. The exposed copper interconnect functions as a seed layer for electroplating or electroless plating within the opening. The electroplating or electroless plating bath may further comprise an antisuppressor additive, a suppressor additive, or a leveler additive.

In another embodiment, the barrier layer and the seed layer at the bottom of the opening can be etched to expose a metallic copper capping material that would likewise serve to act as a nucleation site for copper plating bath additives.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   forming an opening in a dielectric layer disposed on a substrate;
   forming a barrier layer on the opening, the barrier layer comprising a material that prevents the diffusion of a metal across the barrier layer; and
   forming a seed layer on the barrier layer, the seed layer having a noble metal-copper alloy, the copper having less than 50% weight of the noble metal-copper alloy.

2. The method of claim 1 wherein the seed layer further includes a reliability enhancing metal alloy species where the copper and the reliability enhancing metal alloy species having less than 50% weight of the noble metal-copper reliability enhancing metal alloy.

3. The method of claim 1, further comprising:
   filling the opening with copper or a copper alloy layer using electroplating or electroless plating.

4. The method of claim 1, wherein forming the seed layer further comprises:
   sputter depositing a layer of noble metal-copper alloy or noble metal-copper-reliability enhancing metal alloy from an alloyed sputter target or cosputtering on the upper surface of the barrier layer.

5. The method of claim 1, wherein forming the seed layer further comprises:
   simultaneously introducing a noble metal and Copper precursors during CVD.

6. The method of claim 1, wherein forming the seed layer further comprises:
   simultaneously introducing a noble metal, Copper, and a reliability enhancing metal precursor during CVD.

7. The method of claim 1, wherein forming the seed layer further comprises:
   pulsing a Copper precursor and a noble metal precursor into a reactor during a pulsed CVD process.

8. The method of claim 1, wherein forming the seed layer further comprises:

pulsing a Copper precursor, a noble metal precursor, and a reliability enhancing metal precursor during a pulsed CVD process with or without a plasma treatment during deposition or as a post-treatment.

9. The method of claim 1, wherein forming the seed layer further comprises:
   pulsing a Copper precursor and a noble gas precursor into a reactor during ALD with each pulse followed by a purge gas pulse or reducing gas pulse with or without a plasma treatment during or after one or more pulse steps.

10. The method of claim 1, wherein forming the seed layer further comprises:
    pulsing a Copper precursor, a noble gas precursor, and a reliability enhancing metal precursor into a reactor during ALD with each pulse followed by a purge gas pulse or reducing gas pulse with or without a plasma treatment during or after one or more pulse steps.

11. The method of claim 1, wherein the noble metal substantially comprises a material selected from the group consisting of silver, palladium, platinum, rhodium, ruthenium, gold, iridium and osmium and combinations thereof.

12. The method of claim 1, wherein the barrier layer substantially comprises a material selected from the group consisting of tantalum, tungsten, titanium, ruthenium, tantalum nitride, tungsten nitride, titanium nitride, ruthenium nitride, tantalum silicide, tungsten silicide, titanium suicide, ruthenium silicide, tantalum carbide, tungsten carbide, titanium carbide, ruthenium carbide, and combinations thereof.

13. A method comprising:
    forming an opening in a dielectric layer disposed on a copper interconnect of a substrate;
    forming a barrier layer on the opening, the barrier layer comprising a material that prevents the diffusion of a metal across the barrier layer;
    forming a seed layer on the barrier layer, the seed layer comprising a noble metal; and
    etching the barrier layer and the seed layer at the bottom of the opening to expose the underlying copper interconnect.

14. The method of claim 13, wherein etching further comprises:
    exposing a metallic copper capping material to act as a nucleation site for copper plating bath additives.

15. The method of claim 13, further comprising:
    electroplating or electroless plating a copper or a copper alloy on the seed layer; and
    filling the opening, the exposed copper from the copper interconnect functioning as a seed layer and enhancing the initial plating rate at the bottom of the opening.

16. The method of claim 15, wherein an electroplating or electroless plating bath further comprises an antisuppressor additive, a suppressor additive, or a leveler additive.

17. The method of claim 13, wherein the noble metal substantially comprises a material selected from the group consisting of silver, palladium, platinum, rhodium, ruthenium, gold, iridium and osmium and combinations thereof.

18. The method of claim 13, wherein the barrier layer substantially comprises a material selected from the group consisting of tantalum, tungsten, titanium, ruthenium, tantalum nitride, tungsten nitride, titanium nitride, ruthenium nitride, tantalum silicide, tungsten silicide, titanium silicide, ruthenium suicide, tantalum carbide, tungsten carbide, titanium carbide, ruthenium carbide, and combinations thereof.

19. The method of claim 13 further comprising:
    immersing the copper interconnect of the substrate in a plating cell to fill the opening.

20. The method of claim 19 wherein the plating cell further comprises an anti-suppressor additive (ASUPP) without a suppressor or leveler.

* * * * *

UNITED STATES PATENT AND TRADEMARK OFFICE
CERTIFICATE OF CORRECTION

| | | |
|---|---|---|
| PATENT NO. | : 7,694,413 B2 | Page 1 of 1 |
| APPLICATION NO. | : 11/479399 | |
| DATED | : April 13, 2010 | |
| INVENTOR(S) | : Johnston et al. | |

It is certified that error appears in the above-identified patent and that said Letters Patent is hereby corrected as shown below:

In column 7, at line 26 delete, "suicide" and insert --silicide--.

In column 8, at line 27 delete, "suicide" and insert --silicide--.

Signed and Sealed this
Nineteenth Day of April, 2011

David J. Kappos
*Director of the United States Patent and Trademark Office*